(12) United States Patent
Casarsa

(10) Patent No.: US 11,747,398 B2
(45) Date of Patent: Sep. 5, 2023

(54) SCAN CHAIN CIRCUIT AND CORRESPONDING METHOD

(71) Applicant: STMICROELECTRONICS S.r.l., Agrate Brianza (IT)

(72) Inventor: Marco Casarsa, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 13 days.

(21) Appl. No.: 17/665,247

(22) Filed: Feb. 4, 2022

(65) Prior Publication Data

US 2022/0263499 A1  Aug. 18, 2022

(30) Foreign Application Priority Data

Feb. 16, 2021 (IT) .......................... 102021000003536

(51) Int. Cl.
*G01R 31/3177* (2006.01)
*G01R 31/3185* (2006.01)
*H03K 3/037* (2006.01)
*H03K 19/21* (2006.01)

(52) U.S. Cl.
CPC . *G01R 31/3177* (2013.01); *G01R 31/318541* (2013.01); *G01R 31/318552* (2013.01); *G01R 31/318594* (2013.01); *H03K 3/0372* (2013.01); *H03K 19/21* (2013.01)

(58) Field of Classification Search
CPC ........ G01R 31/3177; G01R 31/318541; G01R 31/318552; G01R 31/318594; H03K 3/0372; H03K 19/21

USPC ......................................... 714/726, 729, 731
See application file for complete search history.

(56) References Cited

U.S. PATENT DOCUMENTS

| | | | |
|---|---|---|---|
| 6,901,544 B1 | 5/2005 | Huth et al. | |
| 8,866,527 B1 | 10/2014 | Lewis | |
| 2003/0197541 A1* | 10/2003 | Campbell | ...... G01R 31/318552 327/295 |
| 2006/0026473 A1* | 2/2006 | Patrick Tan | ... G01R 31/318541 714/726 |
| 2009/0240997 A1* | 9/2009 | Hasegawa | ........ G01R 31/31727 714/E11.155 |
| 2010/0318862 A1* | 12/2010 | Niiyama | ........ G01R 31/318552 714/E11.155 |
| 2015/0212150 A1* | 7/2015 | Mittal | ............ G01R 31/318552 714/727 |
| 2016/0241219 A1 | 8/2016 | Kim et al. | |
| 2019/0089337 A1* | 3/2019 | Venugopal | ............ H03K 3/0372 |
| 2022/0263499 A1* | 8/2022 | Casarsa | .......... G01R 31/318594 |
| 2023/0079823 A1* | 3/2023 | Ooigawa | ........ G01R 31/318536 714/731 |

* cited by examiner

*Primary Examiner* — John J Tabone, Jr.
(74) *Attorney, Agent, or Firm* — SEED IP LAW GROUP LLP

(57) ABSTRACT

The disclosure relates to a scan chain circuit comprising cascaded flip-flops having a functional input node and a test input node configured to be selectively coupled to logic circuitry at a clock edge time. A clock line is provided configured to distribute one or more clock signals to the flip-flops in the chain, wherein the flip-flops in the chain have active clock edges applied thereto at respective clock edge times. The chain of flip-flops comprise a set of flip-flops configured to receive an edge inversion signal and to selectively invert their active clock edges in response to the edge inversion signal being asserted.

20 Claims, 3 Drawing Sheets

SCAN CHAIN CIRCUIT AND CORRESPONDING METHOD

BACKGROUND

Technical Field

The description relates to screening techniques for semiconductor devices.

One or more embodiments can be applied advantageously, yet not exclusively, to semiconductor devices intended for use in the automotive sector; in that sector, automotive system manufacturers expect component suppliers to ship components with 0 ppm, that is, devices having zero failures per million devices.

Description of the Related Art

Burn-in and dynamic voltage stress at high voltage (briefly, HVST) are conventionally used to screen the "infant" mortality rate of semiconductor devices.

An approach which is often used is based on scan architectures which facilitate stressing various internal nodes of a device.

Scan chains might face problems related to high-voltage operation in so far as such architectures may be sensitive to "hold" timing violations.

These violations may not be easy to identify or fix. This results in a potentially high area penalty: these violations may in fact correspond to stress conditions outside the functional range dictated by specifications. If such a condition arises, a corresponding library cannot be characterized and this militates against a precise analysis.

BRIEF SUMMARY

According to one or more embodiments, a circuit is provided.

Scan chain architecture may be exemplary of such a circuit.

One or more embodiments may relate to a corresponding method.

A scanning method wherein a sampling edge of consecutive flip-flops (FFs) can be set as function of a logic value may be exemplary of such a method.

One or more embodiments may include a clock inversion logic applied to FFs.

One or more embodiments may include flip-flops having a pin configured to keep or invert a sampling edge.

This facilitates implementing solutions without custom flip-flops by simply adding (outer) clock inversion logic the flip-flops.

For instance, one or more embodiments may involve the addition of a pin (e.g., "CKT") on each flip-flop configured to keep or invert the sampling edge of consecutive flip-flops as a function of a logic value present at that pin.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

As discussed, while representing an approach frequently adopted in order to screen "infant" mortality of semiconductor devices, stress testing at high supply voltage suffers from the fact that the devices tested are not per se designed to work in such extreme conditions.

As a result, burn-in and dynamic voltage stress (DVS) at high voltage (HVST) turn out to be critical in so far as the devices tested are pushed beyond their functional specifications.

In fact, such an approach relies on the rationale that, when applying a stress voltage above the specifications, an increased voltage applied results in a stress time of reduced duration (and in reduced costs of testing). However, operating a circuit in such "out-of-range" conditions may have undesired implications in terms of design complexity (for instance, timing corners may not be available) and area overhead.

Figure 1:
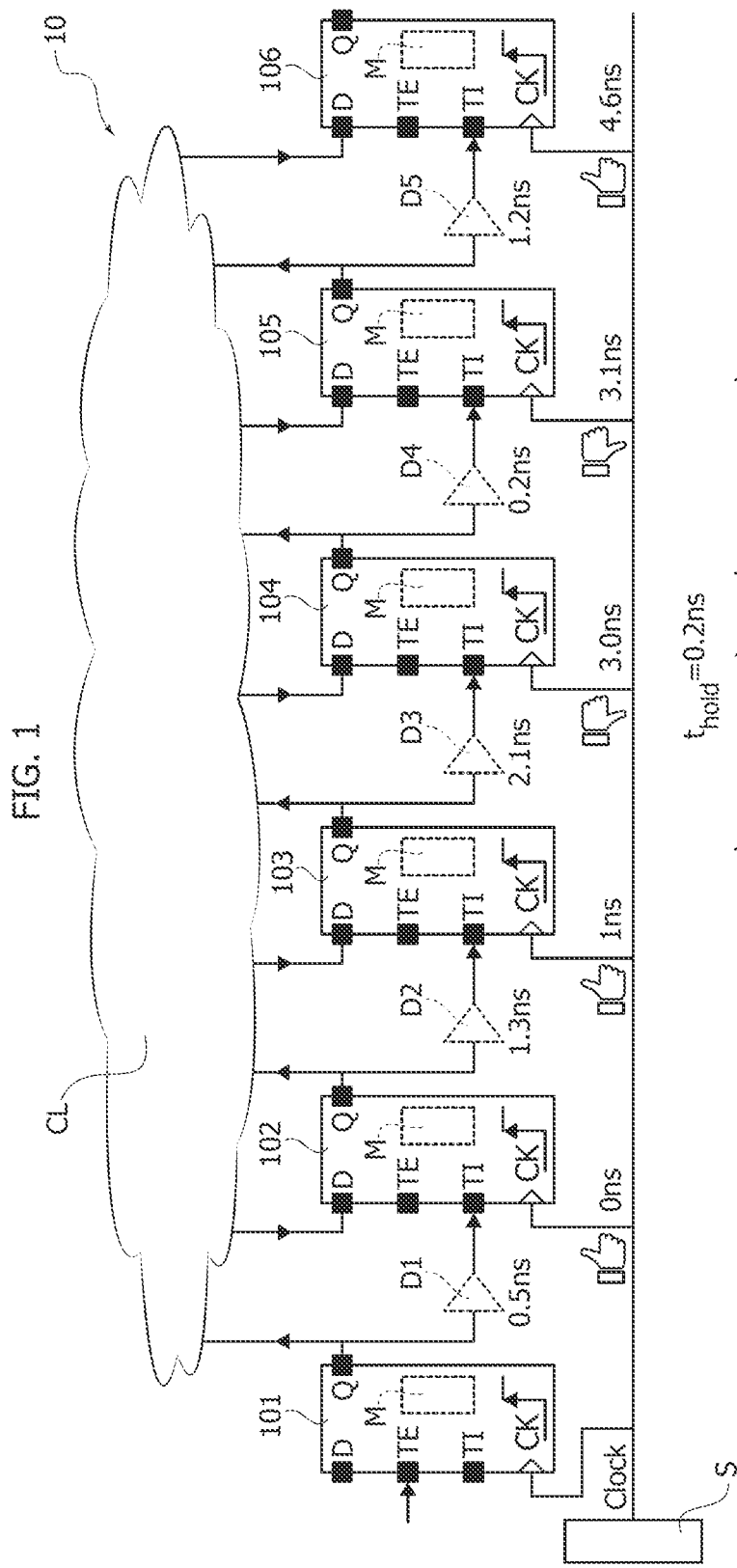
FIG. 1 is a block diagram exemplary of conventional scan chain architecture.

Scan chains such as the one designated 10 as illustrated in FIG. 1 are conventionally used to detect possible faults/defects in a (combinational) logic CL of an electronic circuit (not visible as such for simplicity).

Automatic test pattern generation (ATPG) facilitates generating stimulus test patterns in such a way that (virtually) all the nodes present in the logic CL are stimulated and verified for manufacturing defects/faults using techniques such as, for instance (among various techniques used to facilitate achieving a desired ppm performance), burn-in and dynamic voltage stress at high voltage (briefly, HVST).

As conventionally appreciated by those of skill in the art, a basic purpose of scan architecture 10 as illustrated in FIG. 1 is to detect faults in the logic CL, both combinational and sequential (the flip-flops), and also in the clock tree. Flips-flops are covered implicitly (they can be detected by implication, in so far as otherwise the scan chain cannot shift) and the combinational logic is tested thanks to the pattern generated.

A scan chain 10 as illustrated in FIG. 1 includes a set of cascaded scan flip-flops 101, 102, 103, 104, 105 and 106 clocked by a clock signal applied via a line Clock to the CK nodes of the flip-flops.

Such a clock signal can be generated in a manner known to those of skill in the art via a control circuit S.

While six flip-flops are exemplified here for ease of explanation, the chain 10 may in fact comprise a different number, virtually any plural number of flip-flops.

Also, flip-flops belonging to a same clock domain (that is, sharing a single clock signal) will be considered throughout for simplicity and ease of understanding; in fact, the discussion herein may apply to scan chains operating with different clock signals/in different clock domains.

In a current implementation, scan flip-flops as illustrated herein internally have a multiplexer M at their input.

A test enable signal (generated in a manner known to those of skill in the art, for instance via the control circuit S—the related connection is not visible for simplicity of representation) applied to test enable nodes TE of the flip-flops determines whether a D (functional) input or a TI (test) input reaches to the output Q of the flip-flop when an active clock edge comes at CK.

In a full scan arrangement, all the flip-flops in the logic CL are replaced with scan flip-flops.

These are connected together in form of a scan chain which acts as a shift register when the design is in a Shift Test Mode (that is, with the test enable signal TE asserted). The first flip-flop of the scan chain is connected to a scan input and the last flip-flop in the scan chain is connected to a scan output.

Scan chain operation can be regarded as involving three stages, namely scan in (this is the scan_in shift mode phase where the FFs in the chain are loaded through scan in pins serially), capture (the design is kept in functional timing mode and test pattern response is captured) and scan out (this is the scan-out shift mode phase where FFs in the chain are un-loaded through scan out pins; scan-in phase can proceed concurrently).

It noted that in so-called "partial scan" arrangements some of the flip-flops may not be configured to act as scan flip-flops. A full scan arrangement facilitates improving test results against somewhat increased complexity.

Structure and operation of a scan chain as discussed previously is otherwise conventional in the art. Reference may be had in that respect, merely by way of example, to S. Sharma: "Scan Chains: PnR Outlook" (see design-reuse.com). This makes it unnecessary to provide a more detailed description herein.

An issue related to operation of a scan chain 10 as illustrated in FIG. 1 may lie in that, e.g., due to the different physical locations of the flip-flops 101 to 106 in the chain, the active clock edges in the clock signal from the control circuit S may arrive at the clock nodes CK of the various flip-flops 101, 102, 103, 104, 105 with different delays. See, for instance, the—purely exemplary—values 0 ns, 1 ns, 3.0 ns, 3.1 ns and 4.6 ns indicated in FIG. 1 for the flip-flops 102 to 106. In this—purely exemplary—representation, the flip-flop 101 is assumed to have 0 ns delay.

Similarly, for the same reasons, signals at the TI (test) inputs may be received during the test mode with different delays D1, D2, D3, D4, D5 (see, for instance, the—purely exemplary—values 0.5 ns, 1.3 ns, 2.1 ns, 0.2 ns and 1.2 ns indicated in FIG. 1 for the TI inputs of the flip-flops 102, 103, 104, 105, and 106, respectively).

Figure 2:
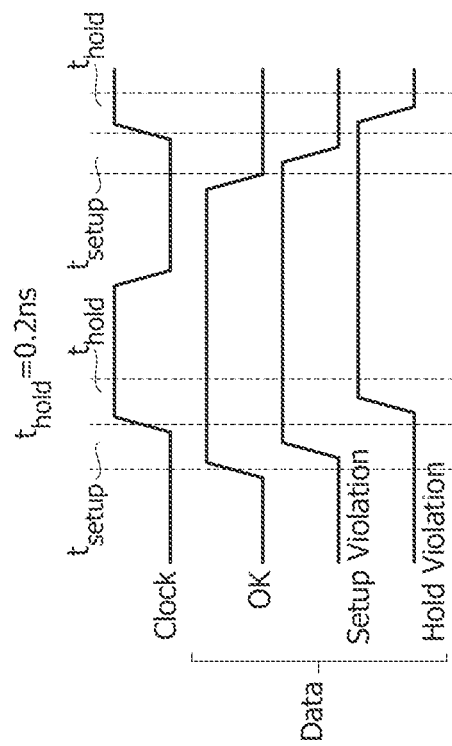
FIG. 2 is a time diagram exemplary of a possible time behavior of certain signals which may occur in scan chain architecture as per FIG. 1.

As illustrated in FIG. 2, proper operation of the scan chain is facilitated when no level changes occur in these signals input during a $t_{setup}$ interval and a $t_{hold}$ interval before and after the active clock edge coming at CK.

FIG. 2 represents (merely by way of example with reference to a possible value of $t_{hold}$ equal to 0.2 ns) three possible time behaviors of such a signal against the time behavior of active clock edge coming at CK.

Of these three possible time behaviors (collectively referred to as Data):

the first one, labeled OK, corresponds to a desirable time behavior with no level transitions during the $t_{setup}$ and the $t_{hold}$ intervals;

the second one, labeled Setup Violation, corresponds to a level transition during the $t_{setup}$ interval of the clock signal; and the third one, labeled Hold Violation, corresponds to a level transition during the $t_{hold}$ interval of the clock signal.

In general terms (referring by way of example to a pair of adjacent flip-flops $10_j$ and $10_{j+1}$ in the cascaded arrangement of FIG. 1), correct operation of the scan chain is facilitated by having:

$$Ckdel10_j - Ckdel\,10_{j+1} + Dj > t_{hold}$$

where:

$Ckdel10_j$ and $Ckdel10_{j+1}$ indicate the clock delays at the flip-flops $10_j$ and $10_{j+1}$, respectively, and Dj is the time delay associated with the block Dj (j=1, . . . , 5) in FIG. 1.

The—purely exemplary—numerical values reported in FIG. 1—are exemplary of a situation where hold violations may affect the flip-flops 104 and 105, which militate against correct shift operation of the scan chain 10.

With the—purely exemplary—numerical values reported in FIG. 1, namely, Ckdel104=3.0 ns, Ckdel105=3.1 ns and D4=0.2 ns, and assuming (merely by way of example) $t_{hold}$=0.2 ns, the desired relationship will not be met, with an undesired hold violation resulting in unsatisfactory operation (thumbs down in FIG. 1).

It is noted that the related timing of the signals as discussed in the foregoing is dependent on circuit layout and the manufacturing technology and cannot be changed with pattern generation.

A possible solution to fix the (hold) time issues discussed in the foregoing may involve adding further buffers such as D1, . . . , D5 between the Q and TI nodes of the flip-flops, on top of those added to prevent violations at the design rule checking (DRC), that is to increase the delay Dj in order to meet the rule mentioned in the foregoing.

A drawback of this solution may be related to the fact that it is not intrinsically robust.

Also, hold analysis may be involved in order to facilitate adequate functionality in forecasting a Voltage and Temperature corner (briefly, VT Corner) used in burn-in/dynamic voltage stress conditions.

In most instances, library characterization models of these VT corner conditions are not available in so far as these are out of functional specifications.

Also, in case different threshold cell types are used on data and clock paths—i.e., standard Vt (SVT), low Vt (LVT) and ultra-low Vt (ULVT)—the respective derating factors might be different, which undesirably involves a specific analysis.

Another possible solution to mitigate "hold" violations would involve separate outputs provided for certain sequential cell elements (such as flip-flops). For instance, a functional Q node may be connected to the functional logic CL only and a scan out node may be connected only to the next test input TI node. Such a scan out driver could be designed with low strength to have a delay in the signal propagation (3 ns, for instance).

This would create an infrastructure which is somewhat more robust in respect of hold time failure as possibly induced by high voltage operation.

However, this solution would not be intrinsically robust and would be unable to be verified when VT corner information is not available, with an ensuing risk that potential critical issues may surface only at the semiconductor level ("on silicon").

In one or more embodiments, possible hold violations between consecutive flip-flops in a scan chain such as 10 can be countered by changing the sampling edges of adjacent subsequent (consecutive) flip-flops in the scan chain.

Figure 3:
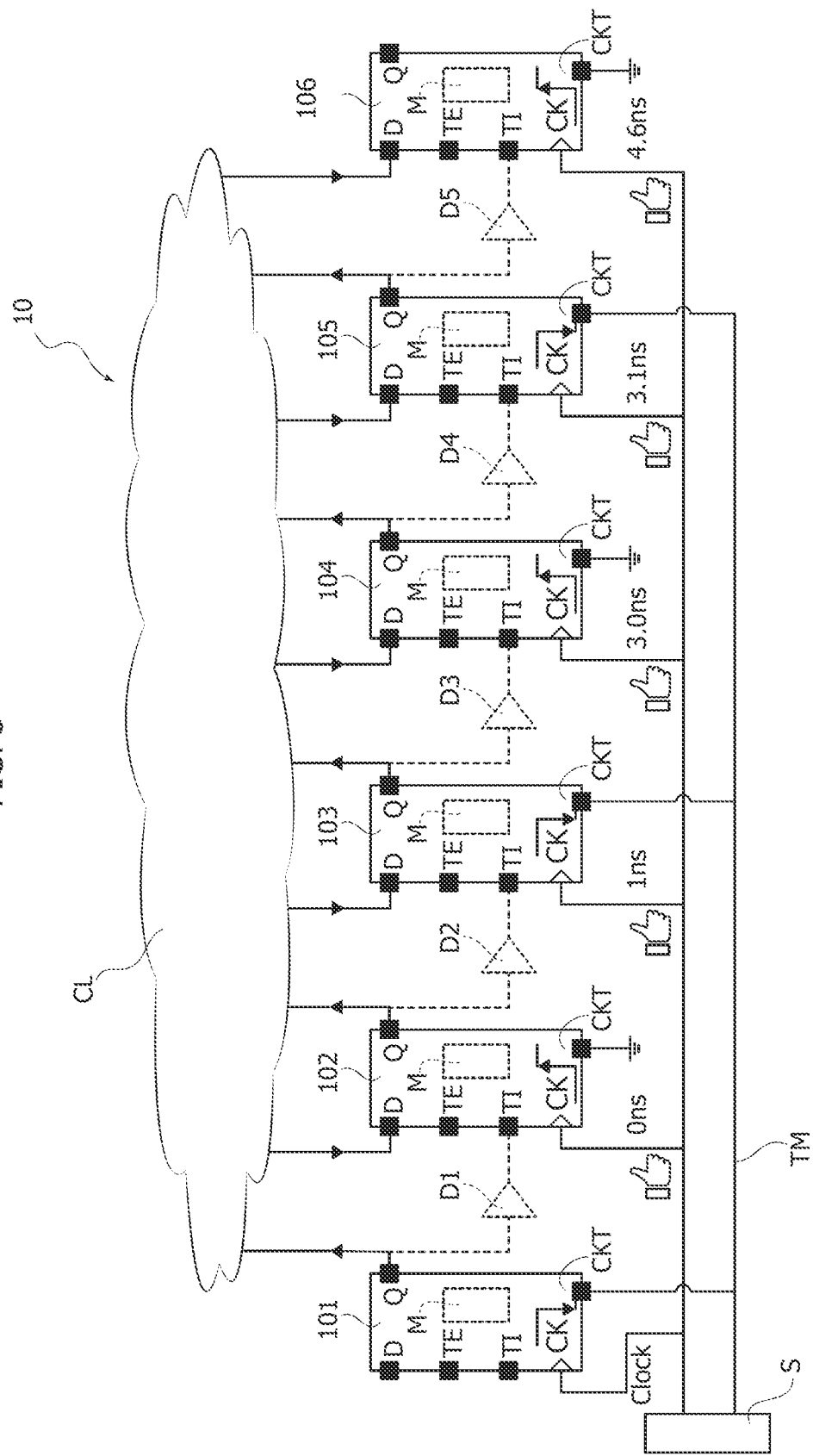
FIG. 3 is a block diagram exemplary of scan chain architecture as per embodiments of the present description.

A scan chain 10 exemplary of such embodiments is exemplified in FIG. 3.

Unless the context indicates otherwise, parts or elements like parts or elements already discussed in connection with FIG. 1 are indicated with like reference signs so that a corresponding description will not be repeated for brevity.

In FIG. 3 a scan chain 10 used for techniques such as burn-in and dynamic voltage stress at high voltage (briefly, HVST) again includes a set of cascaded flip-flops 101, 102, 103, 104, 105 and 106 clocked by a clock signal applied via a line Clock to the CK nodes of the flip-flops.

Again, while six flip-flops are exemplified for ease of explanation, the chain 10 may in fact comprise a different number, virtually any plural number of flip-flops.

In one or more embodiments as exemplified in FIG. 3, in order to change the sampling edges of adjacent subsequent (consecutive) flip-flops in the scan chain, a node (pin) CKT is added on each flip-flop 101 to 106 in the chain 10, with the node CKT configured to:

keep the original clock edge when at '0' logic value (user mode), and to invert the edge of flip-flops such as 101, 103 and 105 when at '1' value (test mode).

This latter arrangement is exemplified in FIG. 3 by showing the flip-flops 101, 103 and 105 with a falling edge at CK, while the flip-flops 102, 104 and 106 retain a rising edge at CK.

As exemplified in FIG. 3, edge inversion takes place in an alternate sequence, for instance starting from the first flip-flop 101 in the chain.

It is noted that:
in certain (otherwise rare) cases the flip-flops in the scan chain 10 may already have mixed rising/falling edges; and
in certain cases, the flip-flops in the scan chain 10 may be "natively" of a falling-edge type so that edge inversion may be from falling to rising when active.

For the sake of simplicity, the instant exemplary representation refers to flip-flops 101 to 106:
(all) of a rising-edge type—these are usually more common that than falling-edge type—so that edge inversion can be assumed to be from rising to falling (see the flip-flops 101, 103 and 105), and
which belong to a same clock domain (that is, sharing a single clock signal), while one or more embodiments may involve different clock signals/domains.

It will be appreciated that the embodiments are not limited to such exemplary representation and/or to either type of flip-flops, in so far as they rely on possible inversion of the original edge (irrespective of rising or falling).

As exemplified in FIG. 3, the flip-flops 101 to 106 can be regarded as arranged in pairs, namely:

101, 102;
102, 103;
103, 104;
104, 105; and
105, 106 with each pair including an "upstream" flip-flop and a "downstream" flip-flop in the pair, wherein one of the flip-flops in the pair (e.g., the upstream flip-flop in the pair, here the odd-numbered flip-flops 101, 103, 105 in the chain) undergoes edge inversion (rising to falling, for instance) while the other flip-flop in the pair (e.g., the downstream flip-flop in the pair, here the even-numbered flip-flops 102, 104, 106 in the chain) does not undergo edge inversion and retains, e.g., a rising edge at CK.

As a result, of edge inversion, adjacent flip-flops in the chain (here 101 and 102, 102 and 103, 103 and 104, 104 and 105, 105 and 106) will have mutually opposed (inverted) sampling edges.

In one or more embodiments as exemplified in FIG. 3, the CKT pins of the flip-flops 101 to 106 in the scan chain are coupled to a line TM to which a test mode signal (generated in the control circuit S, for instance) is applied in order to be enabled (only) during high-voltage manufacturing testing. It is noted that such a signal can be both static and dynamic (that is, always active in shift while active or not in capture).

It is noted that the line TM will be generally different from the Test Enable (TE) input to the flip-flops, which goes high when shift is performed, and in capture mode.

This facilitates having the line TM normally set stable to active mode when Burn-In HVST is performed, with the Test Enable (TE) input to the flip-flops activated (high) during shift and deactivated (low) during capture.

It is otherwise noted that in certain conditions the line TM could be kept low in capture also in Burn-In.

The representation of FIG. 3 shows the inputs CKT of the odd-numbered flip-flops 101, 103, 105 (edge inversion) coupled to the line TM and the inputs CKT of the even-numbered flip-flops 102, 104, 106 (no edge inversion) coupled to ground.

It will be appreciated that this representation is merely for ease of description insofar as (as discussed in the following) all of the flip-flops 101 to 106 may be coupled to the line TM and be configured to provide or not to provide for edge inversion based on logic signal processing.

As illustrated in FIG. 3 not all of the flip-flops in the chain 10 are connected to the line TM in order to facilitate alternating clock edges (e.g., falling, rising, falling, rising, falling, rising). As exemplified, this result can be achieved simply by connecting every other flip-flop (e.g., one flip flop of every two flip flops or by alternating between flip flops) in the chain to TM or to GND.

It will be otherwise appreciated that, in the presence of, say, a flip-flop (103, by way of example) "natively" of a falling edge type, the node CKT at that flip-flop can be regarded as connected to GND insofar as the rule of edge inversion between adjacent flip-flops (with respect to the flip-flops 102 and 104, in the exemplary case considered) is already respected without a connection to CKT.

One or more embodiments thus rely on the recognition that having edges inverted as discussed previously provides a half-clock-period margin.

In conventional solutions as illustrated in FIG. 1, the clock signals to the flip-flops 101 to 106 are all "aligned" (see the rising edges at CK in FIG. 1), which results in the relationship $$Ckdel10_j - Ckdel10_{j+1} + Dj > t_{hold}$$

introduced in the foregoing.

By way of contrast, as a result of having edges inverted as discussed previously in connection with FIG. 3, a new rule applies, namely:

$$Ckdel10_j + Dj < Ckhalfperiod + Ckdel10_{j+1} + t_{setup}$$

where, again $Ckdel10_j$ and $Ckdel10_{j+1}$ indicate the clock delays at a pair of adjacent flip-flops $10_j$ and $10_{j+1}$, respectively, Dj is the associated time delay (j=1, . . . 5), and Ckhalfperiod denotes the half-period of the clock signal Clock.

This relationship indicates that inverting edges as discussed previously provides a half-clock-period margin which facilitates avoiding hold violations (see the third diagram in FIG. 2, for example), by possibly turning $t_{hold}$ issues (at most) into setup issues which are less adverse to proper operation.

In fact, CKhalfperiod can be increased—that is the clock frequency decreased—in order to accommodate Dj and/or the two values for $Ckdel10_j$ and $Ckdel10_{j+1}$ to (further) facilitate correct shift operation.

As discussed, such an edge inversion can be integrated in the flip-flops such as 101 to 106 (as represented in FIG. 3, where the inputs CKT of the flip-flops are illustrated coupled alternately to the line TM and to ground) or added as an outer functionality.

Figure 4:
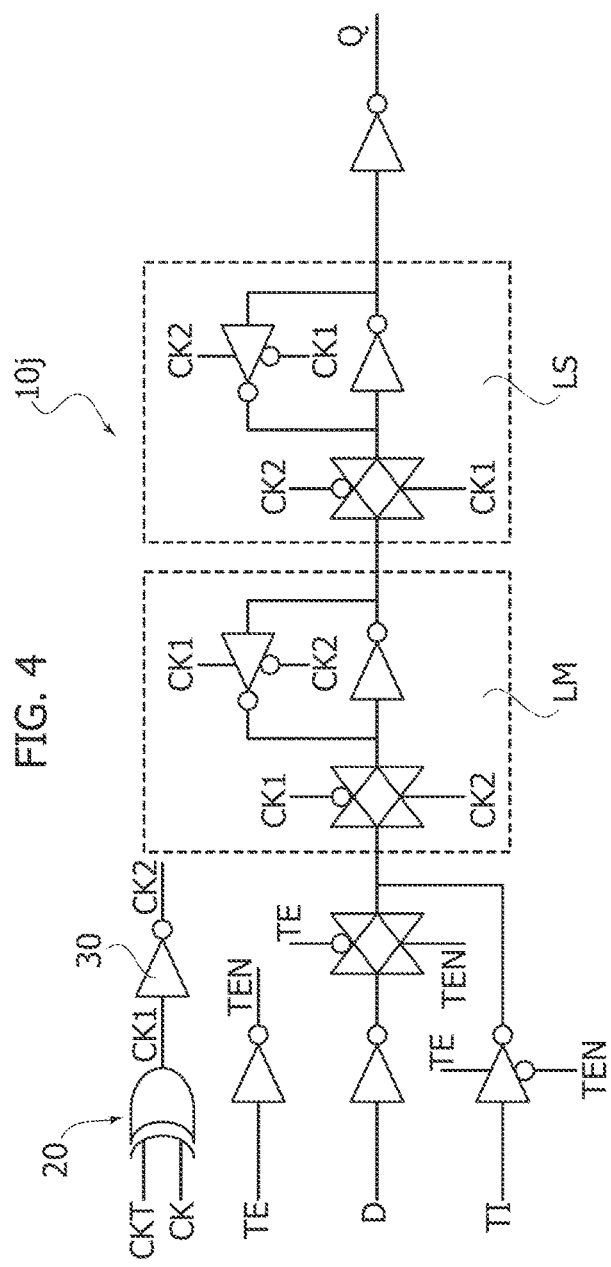
FIG. 4 is a circuit diagram exemplary of possible details of scan cell architecture as illustrated in FIG. 3.

FIG. 4 is exemplary of a possible implementation of a flip-flop cell library for a generic flip-flop $10_j$ (j=0, 1, . . . , 6) as exemplified in FIG. 3 with an EX-OR logic 20 on the clock input to invert the clock edge with minor area overhead.

In the circuit diagram of FIG. 4, LM and LS indicate (otherwise conventional) latch master and latch slave circuitry providing (e.g., via a logic inverter) the Q output for each flip-flop.

Similarly, conventional arrangements are illustrated in FIG. 4 for supplying the latch master circuitry LM with signals derived from the TE, D and TI inputs of the flip-flop $10j$.

In the possible implementation of FIG. 4, the EX-OR gate 20 receives at its inputs the signals on the lines Clock (CK) and TM (CKT) and provides an output signal CK1 which (after logic inversion at a logic inverter 30) provides clock signal CK2. The signal CK2 can be applied together with CK1 to both the latch master circuitry LM and the latch slave circuitry LS in order to provide the Q output as desired for each flip-flop.

Figure 5:
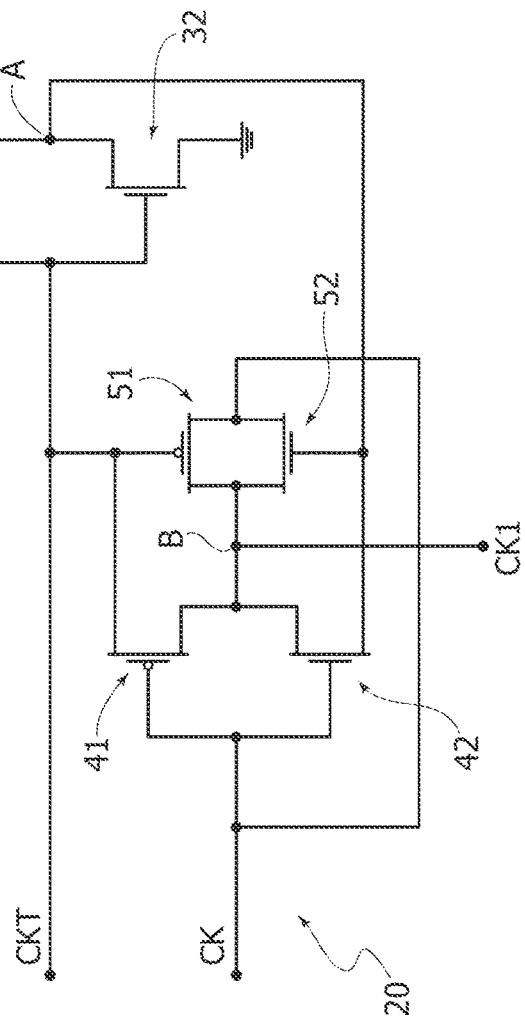
FIG. 5 is an exemplary transistor level representation of certain details of FIG. 4.

FIG. 5 is a transistor level representation of a possible implementation of the EX-OR circuitry 20 including three pairs of electronic switches such as MOSFET transistors 31, 32; 41, 42; and 51, 52.

As exemplified in FIG. 5, the transistors 31, 32 in the first pair:

comprise complementary (p− and n−) MOSFET transistors having the current paths therethrough (source-drain in the case of field-effect transistors such as MOSFET transistors) mutually cascaded in a current flow line between a supply node V+ and ground via a resistor $R_{SS}$ (referred to V+) with an intermediate node A between the transistors 31 and 32; and have their control nodes (gates in the case of field-effect transistors such as MOSFET transistors) jointly coupled to the input node CKT to be alternately switched on (made conductive) and off (made non-conductive) as a function of the signal at the node CKT.

As exemplified in FIG. 5, the transistors 41, 42 in the second pair:

comprise complementary (p- and n-) MOSFET transistors having the current paths therethrough (source-drain in the case of field-effect transistors such as MOSFET transistors) mutually cascaded in a current flow line between the input node CKT and the node A between the transistors 31 and 32 with an intermediate node B between the transistors 41 and 42 (and likewise intermediate the transistors 51 and 52) providing the signal CK1; and have their control nodes (gates in the case of field-effect transistors such as MOSFET transistors) jointly coupled to the input node CK to be switched on (made conductive) and off (made non-conductive) as a function of the signal at the nodes CK and CKT: for instance, when CKT=1 then CK can enable (make conductive) one of the two transistors 41, 42; when CKT=0 neither of these can be enabled irrespective of the logic value of CK.

As exemplified in FIG. 5, the transistors 51, 52 in the third pair:

comprise complementary (p− and n−) MOSFET transistors having the current paths therethrough (source-drain in the case of field-effect transistors such as MOSFET transistors) arranged in parallel between the node CK and the node B between the transistors 41 and 42; and have their control nodes (gates in the case of field-effect transistors such as MOSFET transistors) coupled to the input node CKT (transistor 51) and the node A between the transistors 31 and 32 (transistor 52).

The diagrams of FIGS. 4 and 5 are exemplary of possible implementations of the reduced area overhead advantageously associated with an EXOR structure. Those of skill in the art will otherwise easily understand that these implementations are merely exemplary and not limitative of the embodiments.

One or more embodiments as exemplified herein may advantageously provide a flexible solution which facilitates:

preventing possible hold violations (primarily by simply decreasing the shift frequency);

optimizing the area overhead and reducing the timing impact on clock design for specific flip-flops; and providing a solution applicable also to designs without custom flip-flop structures by simply adding clock inversion logic (possibly outside the flip-flop architecture).

In this latter respect, both optimizing the flip-flop structure embedding an EXOR logic (as presented in FIGS. 4 and 5 merely by way of possible example) or adding the EXOR logic outside the flip-flops (thus avoiding using custom flip-flops) represents viable options.

Additionally, one or more embodiments as exemplified herein may advantageously provide fault coverage of an added CKT signal provided during ATPG manufacturing test.

One or more embodiments as exemplified herein may effectively address issues related to the fact that voltage stress may represent a challenge in so far as the circuit (logic) being screened is forced to operate (well) above its functional specifications.

As noted, a conventional scan method as currently used to stress a device in such extreme conditions may suffer from drawbacks related to the fact that the scan architecture rely on a hold timing in order to facilitate correct shift operation which may otherwise be critical and area consuming.

One or more embodiments facilitate overcoming such a limitation via adequate shift operation (also) in these extreme conditions against a reduced area overhead.

Briefly, a circuit (for instance, 10) as exemplified herein may comprise:

a scan chain of cascaded flip-flops (for instance, 101, 102, 103, 104, 105, 106), the flip-flops in the chain having a functional input node (D) and a test input node (TI) configured to be selectively coupled (for instance, via the multiplexer M actuated by the test enable signal applied to test enable node TE) to logic circuitry (for instance, CL) at a clock edge time (see, for instance, $t_{setup}$, $t_{hold}$ in FIG. 2) (the flip-flops in the chain being configured to selectively (M, TE) couple a functional input node (D) and a test input node (TI) to logic circuitry (CL), said flip-flops being triggered by a clock edge at a clock edge time ($t_{setup}$, $t_{hold}$)); and clock circuitry (for instance, the line designated Clock in the figures) configured to distribute at least one clock signal (as noted, one or more embodiments may include different clocks) to the flip-flops in the chain, wherein the flip-flops in the chain have active clock edges (CK) applied thereto at respective clock edge times.

In a circuit as exemplified herein, the flip-flops in the chain may comprise a set (for instance, 101, 103, 105) of flip-flops configured to receive an edge inversion signal (for instance, TM) and to selectively invert said active clock edges in response to said edge inversion signal being asserted.

In a circuit as exemplified herein, said set of flip-flops may consist of non-adjacent flip-flops in the chain (for instance, 101, 103 and 105).

In a circuit as exemplified herein, said set of flip-flops may consists of alternate flip-flops in the chain (for instance, flip-flops 101, 103 and 105) wherein each flip-flop in said set has one or two adjacent flip-flops in the chain configured to maintain said active clock edges irrespective of said edge inversion signal being asserted.

For instance, as exemplified herein:

"edge-inverting" flip-flop 101 has adjacent thereto "edge-maintaining" flip-flop 102;

"edge-inverting" flip-flop 103 has adjacent thereto "edge-maintaining" flip-flops 102 and 104; and "edge-inverting" flip-flop 105 has adjacent thereto "edge-maintaining" flip-flops 104 and 106.

In a circuit as exemplified herein, the flip-flops in said set (for instance, 101, 103, 105) comprise logic circuitry configured to receive said edge inversion signal and to invert said sampling edge in response to said edge inversion signal being asserted.

In a circuit as exemplified herein, said logic circuitry may comprise EX-OR logic circuitry.

In a "normal" flip-flop, such EX-OR circuitry can be replaced with an inverter.

A method as exemplified herein may comprise:

coupling to logic circuitry (for instance, CL) at a clock edge time (see, for instance, $t_{setup}$, $t_{hold}$ in FIG. 2) an input node selected (for instance, via the multiplexer M actuated by the test enable signal applied to test enable node TE) out of a functional input node (for instance, D) and a test input node (for instance, TI) in the flip-flops of a scan chain of cascaded flip-flops (for instance, 101, 102, 103, 104, 105, 106); and distributing at least one clock signal (as noted, one or more embodiments may include different clocks) to the flip-flops in the chain, wherein the flip-flops in the chain have active clock edges applied thereto at respective clock edge times.

A method as exemplified herein may comprise applying an edge inversion signal (for instance, TM) to a set of flip-flops (for instance, 101, 103, 105) in the chain to selectively invert said active clock edge applied thereto.

Advantageously, said edge inversion signal may be applied to said set of flip-flops in the chain during high-voltage and/or temperature testing (for instance, during burn-in and dynamic voltage stress at high voltage—HVST) of said logic circuitry (for instance, CL).

A method as exemplified herein may comprise reducing the frequency of said at least one clock signal (for instance, Clock) distributed to the flip-flops in the chain, with said edge inversion signal applied to said set of flip-flops in the chain.

As discussed, reducing the frequency of the clock signal (namely increasing CKhalfperiod) when the edge inversion signal is applied to these flip-flops facilitates accommodating Dj and/or the two values for Ckdel10$_j$ and Ckdel10$_{j+1}$ in the relationship:

$$Ckdel10_j + Dj < Ckhalfperiod + Ckdel10_{j+1} + t_{setup}$$

introduced in the foregoing, which results in correct shift operation.

A method exemplified herein may comprise applying said edge inversion signal to a set (101, 103, 105) of non-adjacent flip-flops in the chain (for instance 101, 103 and 105 out of 101, 102, 103, 104, 105, 106).

A method as exemplified herein may comprise applying said edge inversion signal to a set of alternate flip-flops in the chain wherein each flip-flop in said set (101, 103, 105) has one or two adjacent flip-flops in the chain configured to maintain said active clock edges (as exemplified by being coupled to ground in FIG. 3).

That is, as exemplified herein:

"edge-inverting" flip-flop 101 has adjacent thereto "edge-maintaining" flip-flop 102;

"edge-inverting" flip-flop 103 has adjacent thereto "edge-maintaining" flip-flops 102 and 104; and "edge-inverting" flip-flop 105 has adjacent thereto "edge-maintaining" flip-flops 104 and 106.

Without prejudice to the underlying principles, the details and embodiments may vary with respect to what has been described by way of example only without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
    a scan chain including a plurality of flip-flops that are cascaded in a chain, each flip-flop of the plurality of flip-flops having a respective functional input node and a respective test input node, each flip-flop of the plurality of flip-flops being configured to be selectively couple the respective functional input node or the respective test input node to logic circuitry, and each flip-flop of the plurality of flip-flops being triggered by a clock edge at a clock edge time; and
    clock circuitry configured to output at least one clock signal to the plurality of flip-flops, wherein active clock edges are applied to the plurality of flip-flops at respective clock edge times,
    wherein the plurality of flip-flops include a set of flip-flops configured to:
        receive an edge inversion signal; and
        selectively invert the active clock edges in response to the edge inversion signal being asserted.

2. The circuit of claim 1, wherein the set of flip-flops includes flip-flops that are non-adjacent to each other in the chain.

3. The circuit of claim 1, wherein the set of flip-flops includes every other flip-flop of the plurality of flip-flops in the chain, wherein each flip-flop in the set of flip-flops has one or two adjacent flip-flops in the chain, and wherein a flip-flop of the one or two adjacent flip-flops is configured to maintain the active clock edges without inversion irrespective of whether the edge inversion signal is asserted.

4. The circuit of claim 1, wherein flip-flops of the set of flip-flops include logic circuitry configured to receive the edge inversion signal and to invert a sampling edge of the active clock edges in response to the edge inversion signal being asserted.

5. The circuit of claim 4, wherein the logic circuitry includes exclusive-or logic.

6. The circuit of claim 1, wherein the set of flip-flops are configured to receive the edge inversion signal during high-voltage and/or temperature testing of the logic circuitry.

7. The circuit of claim 1, wherein a frequency of the at least one clock signal is reduced in response to the edge inversion signal being provided to the set of flip-flops.

8. A method, comprising:
    coupling, at a clock edge time, logic circuitry to a respective functional input node or a respective test input node of flip-flips of a plurality of flip-flops, the plurality of flip-flops being cascaded in a scan chain;
    outputting at least one clock signal to the plurality of flip-flops, wherein active clock edges are applied to the plurality of flip-flops at respective clock edge times; and
    providing an edge inversion signal to a set of flip-flops of the plurality of flip-flops to selectively invert the active clock edge applied to the set of flip-flops.

9. The method of claim 8, comprising:
    providing the edge inversion signal to the set of flip-flops during high-voltage and/or temperature testing of the logic circuitry.

10. The method of claim 8, comprising:
    reducing a frequency of the at least one clock signal in response to the edge inversion signal being provided to the set of flip-flops.

11. The method of claim 8, wherein the set of flip-flops are non-adjacent flip-flops of the plurality of flip-flops in the chain.

12. The method of claim 8, wherein the set of flip-flops includes every other flip-flop in the plurality of flip-flops in the chain, and wherein each flip-flop in the set of flip-flops has one or two adjacent flip-flops in the chain configured to maintain the active clock edges without inversion.

13. The method of claim 8, wherein the logic circuitry includes exclusive-or logic.

14. A system, comprising:
    logic circuitry;
    a scan chain including a plurality of flip-flops that are cascaded in a chain, each flip-flop of the plurality of flip-flops having a respective functional input node and a respective test input node that are configured to be selectively coupled to the logic circuitry at a clock edge time; and
    clock circuitry configured to output at least one clock signal to the plurality of flip-flops, wherein active clock edges are applied to the plurality of flip-flops at respective clock edge times,
    wherein the plurality of flip-flops include a set of flip-flops configured to:
        receive an edge inversion signal; and
        selectively invert the active clock edges in response to the edge inversion signal being asserted.

15. The system of claim 14, wherein the set of flip-flops includes flip-flops that are non-adjacent to each other in the chain.

16. The system of claim 14, wherein the set of flip-flops includes every other flip-flop of the plurality of flip-flops in the chain, wherein each flip-flop in the set of flip-flops has one or two adjacent flip-flops in the chain, and wherein a flip-flop of the one or two adjacent flip-flops is configured to maintain the active clock edges without inversion irrespective of whether the edge inversion signal is asserted.

17. The system of claim 14, wherein flip-flops of the set of flip-flops include logic circuitry configured to receive the edge inversion signal and to invert a sampling edge of the active clock edges in response to the edge inversion signal being asserted.

18. The system of claim 17, wherein the logic circuitry includes exclusive-or logic.

19. The system of claim 14, wherein the set of flip-flops is configured to receive the edge inversion signal during high-voltage and/or temperature testing of the logic circuitry.

20. The system of claim 14, wherein a frequency of the at least one clock signal is reduced in response to the edge inversion signal being provided to the set of flip-flops.

* * * * *